Figure 4:
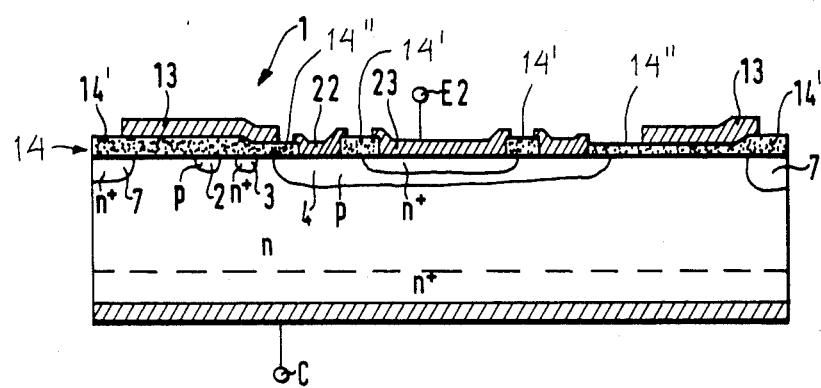

United States Patent [19]

Flohrs et al.

[11] Patent Number: 4,695,867

[45] Date of Patent: Sep. 22, 1987

[54] MONOLITHICALLY INTEGRATED PLANAR SEMICONDUCTOR ARRANGEMENT

[75] Inventors: Peter Flohrs; Hartmut Michel, both of Reutlingen, Fed. Rep. of Germany

[73] Assignee: Robert Bosch GmbH, Stuttgart, Fed. Rep. of Germany

[21] Appl. No.: 775,044

[22] PCT Filed: Apr. 16, 1985

[86] PCT No.: PCT/DE85/00118

§ 371 Date: Aug. 21, 1985

§ 102(e) Date: Aug. 21, 1985

[87] PCT Pub. No.: WO85/05497

PCT Pub. Date: Dec. 5, 1985

[30] Foreign Application Priority Data

May 11, 1984 [DE] Fed. Rep. of Germany ....... 3417474

[51] Int. Cl.⁴ .......................................... H01L 27/02
[52] U.S. Cl. ........................................ 357/46; 357/53
[58] Field of Search ....................... 357/52, 51, 53, 13, 357/46, 52 (U.S. only)

[56] References Cited

U.S. PATENT DOCUMENTS 3,395,290  7/1968  Farina et al. ............................ 357/13
4,564,771  1/1986  Flohrs ................................. 357/46 X
4,599,638  7/1986  Flohrs ................................. 357/53 X
4,618,875  10/1986 Flohrs ................................... 357/46

Primary Examiner—Martin H. Edlow
Assistant Examiner—Sara W. Crane
Attorney, Agent, or Firm—Michael J. Striker

[57] ABSTRACT

A semiconductor arrangement is suggested which is provided with a capacity transistor and a drive transistor in form of a Dralington-circuit. Thereby, the two transistors are monolithically integrated with a planar technique in a common substrate (8), which forms the two collector zones of the two transistors (T1,T2). A passivation layer (14) covers the main face of substrate (8) covering this main surface with the exception of contact windows. A cover electrode (13) is disposed above the passivation layer in the area between the collector zone and the base zone (4) of the capacity transistor (T2), whereby this passivation layer is connected with a resistor strip (2) at a distance from the base zone (4) for adjusting its potential. An additional guard strip (3) is diffused into the main surface between the resistor strip (2) and the base zone (4). In order to prevent a voltage rupture in the area of the resistor strip (2), the passivation layer is designed thinner at the area adjacent the base zone (4) than in the remaining area beneath the cover electrode (13).

3 Claims, 4 Drawing Figures

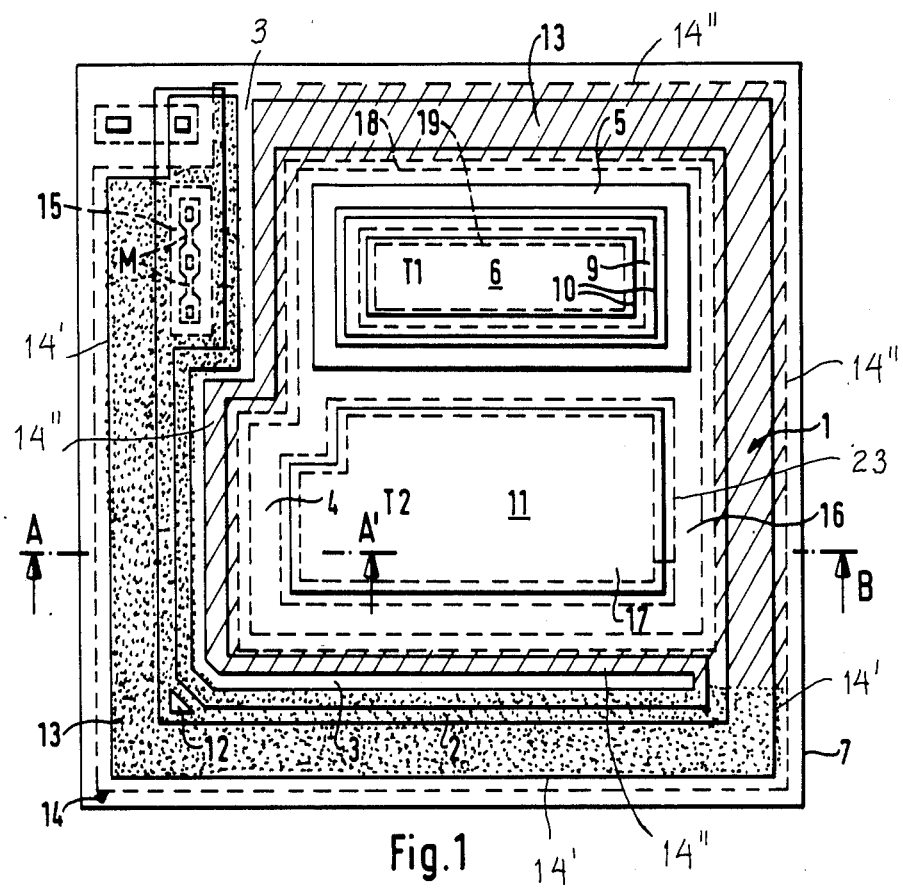
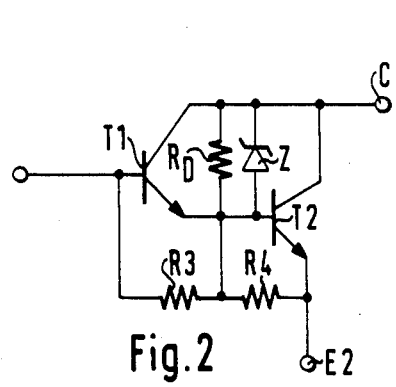
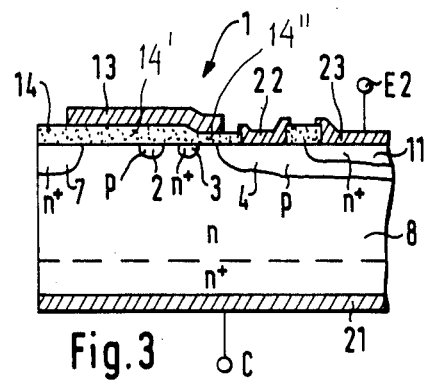

MONOLITHICALLY INTEGRATED PLANAR SEMICONDUCTOR ARRANGEMENT

CROSS-REFERENCE TO THE RELATE APPLICATION

Reference is made to the copending application Ser. No. 525,031, filed Aug. 8, 1983 now issued a U.S. Pat. No. 4,618,875 assigned to the same assignee as this application.

STATE OF THE ART

The invention is based on a semiconductor arrangement which is designed as a Darlington-transistor-circuit with a drive-transistor and a power transistor, with at least one pn-junction being formed by a substrate having a defined type of conductivity and a zone of an opposite type of conductivity being diffused into the substrate, with a cover electrode disposed over a passivation layer which covers the space charging areas being generated in the reverse bias made and which is connected with the tap of a voltage divider which is diffused as a resistor strip at a distance from the pn-junction, with a blocking strip which is diffused into the substrate between the resistor strip and the pn-junction and which is connected with an outer guard ring delimiting the boundary of the semiconductor arrangement. A semiconductor arrangement known from the U.S. Pat. No. 4,618,875 is designed as a Darlington-transistor-conduit, wherein the two transistors are monolithically integrated in a common substrate in accordance with the planar technique. Thereby, the substrate forms the two collector zones of the two transistors. A passivation layer consisting of silicon dioxide is present on the main surface of the substrate, since this layer covers the main surface with the exception of contact windows. The base-collector-transistions of the two transistors are protected by a metal electrode which is above the passivation layer and which can be called a cover electrode. This semiconductor circuit is also provided with an integrated voltge divider, whose pick off is connected with the cover electrode. The electrostatic field which is emitted from the cover electrode influences the break down voltage on the lower disposed base-collector-transitions which are designed as pn-junctions. By a suitable selection of the voltage divider an adjustment of the break down voltage can be performed, which, however, in the known semi-conductor arrangement can be undesirably influenced due to the inverse current. If the inverse current does flow not only within the base but also into the resistor strip, it may result in a staggering or mismatch of the voltage divider and thereby in a severe dependency of the break down voltage on the inverse current. If the arrangement is used for clamping the emitter-collector inverse voltage in that the inverse current controls the base of the transistor the mismatch of the voltage divider finally results in a strong dependency of the clamping voltage on the collector current, since the base current required for controlling is the result of the collector current and the amplification.

ADVANTAGES OF THE INVENTION

In contrast thereto, the semiconductor arrangement in accordance with the invention is advantageous in that a surface rupture in the area of the resistor strip is prevented due to the different thickness of the passivation layer, since the oxide layer in the area of the resistor strip is designed thicker than in the area of the space charge zone which is adjacent to the pn-junction. The inventive semiconductor arrangement may be a Zener diode, a single transistor of a Darlington-circuit. A thinner part of the passivation layer in the area between the blocking strip and the base area of the power transistor of a Darlington-transistor-circuit results in that the inverse current of the surface rupture flows exclusively into the base of the power transistor. The difference thickness of the passivation layer must be selected according to the given requirements, in particular in dependency on the given embodiment of the circuit and the desired clamping voltage. With a Darlington-transistor-circuit which is used for a control circuit for ignition coils for motor vehicles a 0.5-1 um thinner passivation layer is provided in the area between the blocking strip or stop ring and the base zone of the power transistor than in the remainder areas, for example, with a clamping voltage of 400 Volt.

Advantageous further embodiments are disclosed in the remaining subclaims.

DRAWING

The invention is explained in more detail in the following in conjunction with the drawings. The drawings show:

FIG. 1 a plan view of an inventive semiconductor arrangement.

FIG. 2 a block diagram in accordance with FIG. 1;

FIG. 3 a partial section taken along the line A—A' of FIG. 1; and

FIG. 4 a complete section taken along the line A–B of FIG. 1.

In the plan view illustrated in FIG. 1 of a monolithically integrated Darlington-transistor-circuit, a resistor strip 2, a guard strip 3, the base zone 4 of a power transistor T2, an inner guard ring 5 and the base zone 6 of drive transistor T1 are diffused into the main surface 1 of substrate 8 (FIG. 3). The guard strip 3 is connected at one end thereof with an outer stop or guard ring 7, which is also diffused from above into the substrate 8 to delimit the boundary of the circuit.

The emitter zone 9 of the driver transistor T1 is diffused into the base zone 6 of the driver transistor, whereby the emitter zone is shaped annular and its boundary is illustrated in the drawing with full lines 10. The emitter zone 11 of the power transistor T2 is diffused in its base zone 4.

Different metallizations indicated by broken lines in FIG. 1 are provided on the main surface. A cover electrode 13 which is connected with the tap 12 of the resistor strip 2 forms one of such metallizations. This cover electrode 13 is disposed on a passivation layer 14 of silicon oxide which insulates the electrode from the below disposed semiconductor material. The cover electrode 13 is brought to a defined electrical potential due to it connection with the tap 12 of the resistor strip 2. This electrical potential is dependent on the shape of the resistor strip 2 which forms two divider resistors. The breakdown voltage can be adjusted by the selection of the two divider resistors. A detailed description of the mode of operation of cover electrode 13 is made in the aforementioned U.S. Pat. No. 4,618,875.

An opening 15 formed in the cover electrode 13 above the left upper part of the resistor strip 2 exposes a part of the passivation layer 14. Contact windows are provided in the exposed part of passivation layer 14 and are bridged by short circuit metallizations M, by means of which the voltage divider, which consists of the resistor strip 2, is equalizeable.

The remaining metallization 16, 17 and 18, 19 protect the zones therebelow and parts thereof serve as connecting electrodes.

The passivation layer 14 which consists of silicon oxide is shaped differently thick beneath the cover electrode 13. The areas 14′ with the thicker oxide layer are indicated in FIG. 1 with dots, while the hatched area 14″ indicates the area with the thinner oxide layer. The area 14″ of the thinner oxide layer is essentially delimited by the guard strip 3 and the portion of the outer guard ring 7 that faces the base zone 4 of the power transistor T2. The area 14′ of thicker oxide layer is deliminted by the guard strip 3 and the portion of the outer guard ring 7 that faces the resistor strip 2.

FIG. 2 illustrates a block diagram of the Darlington-circuit in accordance with FIG. 1. The resistor which is determining for the cover electrode 13 is designated in this circuit with $R_D$ and is disposed between the commo collector C and the base of the transistor T2. Due to the thinner oxide layer 14″ in the area adjacent the base 4 of the power transistor T2 it is assured that the Zener voltage breakdown occurs between collector C and the base of the transistor T2. A Zener diode Z which is indicated parallel to the resistor $R_D$ symbolizes this relationship.

The further illustrated resistors R3 and R4 which form a voltage divider between the base of the drive transistor T1 and the emitter of the power transistor T2 are not shown in the plan view of FIG. 1.

In the illustrated partial section of FIG. 3 the structure of the monolithically integrated circuit arrangement in accordance with FIG. 1 is illustrated along sectional line A—A'. A metallization 21 is provided on the lower side of substrate 8 which forms the connecting electrode for the common collector connection C. From main surface 1 an n+-doped guard strip 3 and the p-doped base zone of the power transistor T2 are diffused into the substrate 8 which is n-doped. The n+-doped emitter zone 11 of the transistor T2 is diffused into the base zone 4 of the transistor T2. The outer guard ring 7 is n+-doped similarly as the guard strip 3.

The passivation layer 14 which consists of silicon dioxide is disposed below the cover electrode 13, whereby as described above, this layer is thinner in the regions between the guard strip 3 and the base zone 4, and between the guard ring 7 and the base zone 4, than in the reminder area beneath the cover electrode 13.

A metallization 22 is disposed above base zone 4 which is laterally limited by the silicon dioxide which serves as an insulator. A further metallization 23 is disposed above emitter zone 11 which forms the electrode for the emitter connection E2.

Due to the thinner passivation layer 14 in the areas 14″ between the guard strip 3 and the portion of the outer guard ring 7 that faces base zone 4 it is achieved that a surface rupture in the area 14′ of the thicker passivation layer between the portion of guard ring 7 that faces the resistor strip 2 and the inner guard strip 3, is prevented. The inner guard strip 3 should be n+-doped so high that the space charge areas around p-doped base zone 4 and the p-doped resistor strip 2 are separated from each other.

From the sectional view shown in FIG. 4, it is evident that the thinner layer 14″ between the p-n junction 4 and the right-hand part of the outer guard ring 7 is substantially broader than the thicker layer 14′ between the guard strip 3 and the left-hand part of the outer guard ring 7.

We claim:

1. Monolithically integrated planar semiconductor arrangement comprising a substrate of a type of conductivity; at least one zone of an opposite type of conductivity being diffused into the substrate to form a p-n junction; a resistor strip of the same type of conductivity as said zone being diffused into said substrate at a distance from the periphery of said p-n junction, said resistor strip having a tap to form a voltage divider; a highly doped outer guard ring of the same type of conductivity as the substrate being diffused into said substrate to delimit the semiconductor arrangement; a highly doped guard strip of the same type of conductivity as said outer guard ring being diffused into the substrate between said resistor strip and said p-n junction and being connected at one end thereof with the outer guard ring; a passivation layer provided on the substrate; a cover electrode provided on the passivation layer over space-charged areas generated during reversed bias mode of operation, said cover electrode being connected with said tap of the resistor strip; and said passivation layer beneath said cover electrode being thinner in the regions between said p-n junction and said guard strip and between said p-n junction and a facing part of said outer guard ring than in the remaining area beneath the cover electrode.

2. Semiconductor arrangement in accordance with claim 1, wherein the passivation layer is an oxide layer which in said regions is about 0.5 um thinner than in the remaining area.

3. Semiconductor arrangement in accordance with claim 1 designed as a Darlington-transistor circuit with at least one drive transistor and one power transistor, whose collector zones are formed by the substrate, whose base zones are zones of opposite type of conductivity than the substrate and being diffused from a main surface of the substrate into the collector zones, and the passivation layer is designed thinner in the areas between the guard strip and the base zone of the power transistor, and between the outer guard ring and the base zone of the power transistor than in the remaining areas beneath the cover electrode.

* * * * *